(12) United States Patent
Fromhold et al.

(10) Patent No.: US 11,538,602 B2
(45) Date of Patent: Dec. 27, 2022

(54) MAGNETIC OPTIMIZATION

(71) Applicant: THE UNIVERSITY OF NOTTINGHAM, Nottingham (GB)

(72) Inventors: Mark Fromhold, Nottingham (GB); Nathan Welch, Nottingham (GB); Dominic Sims, Nottingham (GB); Jorge Ferreras, Nottingham (GB); Ian Taylor, Nottingham (GB)

(73) Assignee: The University of Nottingham, Northhamptonshire (GB)

( * ) Notice: Subject to any disclaimer, the term of this patent is extended or adjusted under 35 U.S.C. 154(b) by 39 days.

(21) Appl. No.: 17/309,215

(22) PCT Filed: Nov. 11, 2019

(86) PCT No.: PCT/GB2019/053182
§ 371 (c)(1),
(2) Date: May 7, 2021

(87) PCT Pub. No.: WO2020/099842
PCT Pub. Date: May 22, 2020

(65) Prior Publication Data
US 2021/0398706 A1     Dec. 23, 2021

(30) Foreign Application Priority Data

Nov. 9, 2018 (GB) ........................ 1818311
Nov. 30, 2018 (GB) ........................ 1819614
Nov. 30, 2018 (GB) ........................ 1819632

(51) Int. Cl.
*G06F 30/20* (2020.01)
*G21K 1/00* (2006.01)
*H01F 7/20* (2006.01)

(52) U.S. Cl.
CPC ............. *G21K 1/006* (2013.01); *G06F 30/20* (2020.01); *H01F 7/202* (2013.01)

(58) Field of Classification Search
CPC .......... G21K 1/006; G06F 30/20; H01F 7/202
See application file for complete search history.

(56) References Cited

U.S. PATENT DOCUMENTS 6,476,383 B1    11/2002   Esslinger et al.
8,853,613 B1 *  10/2014   Compton ............... G21K 1/006
                                                     250/251

(Continued)

FOREIGN PATENT DOCUMENTS

WO    2016/198716    12/2016

OTHER PUBLICATIONS

Juchem C, Green D, de Graaf RA. Multi-coil magnetic field modeling. Journal of Magnetic Resonance. Nov. 1, 2013;236:95-104. (Year: 2013).*

(Continued)

*Primary Examiner* — Chuen-Meei Gan
(74) *Attorney, Agent, or Firm* — Grossman, Tucker, Perreault & Pfleger PLLC; Kevin J. Carroll

(57) ABSTRACT

A method of designing at least one coil for producing a magnetic field is disclosed. The method comprises: i) setting a performance target comprising: a target magnetic field, and at least two of a target power, a target resistance, a target size and/or weight, a target supply voltage or current, and a target inductance; ii) determining initial design parameters for the at least one coil; iii) modelling performance with the current design parameters to determine a simulated performance against each of the performance targets; iv) calculating a penalty function based on the difference between the simulated performance and the performance targets; v) modifying the design parameters in order to reduce the penalty (Continued)

function; vi) iterating steps iii) to v) until the penalty function or simulated performance has met an acceptance condition.

25 Claims, 9 Drawing Sheets

(56) References Cited

U.S. PATENT DOCUMENTS

| | | | |
|---|---|---|---|
| 2017/0343695 A1* | 11/2017 | Stetson | G01V 3/101 |
| 2017/0359888 A1 | 12/2017 | Imhof | |
| 2018/0286635 A1* | 10/2018 | Zimmerman | H01J 37/32678 |

OTHER PUBLICATIONS

Abbott JJ. Parametric design of tri-axial nested Helmholtz coils. Review of scientific instruments. May 4, 2015;86(5):054701. (Year: 2015).*

Poole MS, While PT, Lopez HS, Crozier S. Minimax current density gradient coils: analysis of coil performance and heating. Magnetic Resonance in Medicine. Aug. 2012;68(2):639-48. (Year: 2012).*

International Search Report from corresponding PCT Application No. PCT/GB2019/053182, dated Apr. 2, 2020.

Written Opinion of the International Searching Authority from corresponding PCT Application No. PPCT Application No. PCT/GB2019/053182, dated Apr. 2, 2020.

Wong, Eric C., A. Jesmanowicz, and James S. Hyde. "Coil optimization for MRI by conjugate gradient descent." Magnetic resonance in medicine 21.1 (1991): 39-48.

Hidalgo-Tobon, S. S. "Theory of gradient coil design methods for magnetic resonance imaging." Concepts in Magnetic Resonance Part A 36.4 (2010): 223-242.

McGilligan, James P., et al. "Grating chips for quantum technologies." Scientific Reports 7.1 (2017): 384.

* cited by examiner

MAGNETIC OPTIMIZATION

FIELD

The present invention relates to a method of designing and/or manufacturing a magnetic coil, or an ensemble of coils, and to a coil (or coils) produced using the method.

BACKGROUND

Numerous applications exist for magnetic coils. In many applications, it is desirable that a magnetic coil produces a specific field when energised with an electrical current. For example, it may be desirable that a uniform field is produced within a specific spatial region within or around a coil. In other examples it may be desirable to produce a highly linear field gradient, or some other specific spatial distribution of field in the region of the coil.

One important application for magnetic coils is in magneto optical traps (MOTs). The magneto-optical trap (MOT) comprises laser light and a magnetic field and operates by exploiting the atom-photon interaction, which depends on both the position and momentum of the atoms. Atoms can be excited by absorbing a photon and then spontaneously emitting another. The emission is usually isotropic, and thus does not change the mean momentum of the atom cloud. However, the absorption process is anisotropic and can thus slow the atoms if the frequency and polarization of the light is chosen correctly. The external magnetic field controls the internal states of the atoms and the absorption rate.

For the MOT to work, it is necessary for the magnitude of the magnetic field to increase with increasing distance from the trap centre. A traditional experimental MOT set-up includes gradient coils, such as an anti-Helmholtz coil pair outside a UHV chamber. The magnetic field is highly inhomogeneous and, in each direction, its strength varies approximately linearly around the trap centre. Traditional laboratory-based MOTs often have hand-made gradient coils positioned outside the UHV chamber, and may further include a set of field cancelling coils, for cancelling background fields (including Earth's field). Such coils typically inhibit the miniaturisation of the apparatus and also consume significant amounts of power.

It is known to use an algorithm to select a more optimal coil design. Wong et al[1] describe an iterative method of coil optimisation based on gradient descent, and Hidalgo et al[2] give a review of methods which have been used to design gradient coils for MRI applications.

[1] Wong, Eric C., A. Jesmanowicz, and James S. Hyde. "Coil optimization for MRI by conjugate gradient descent." Magnetic resonance in medicine 21.1 (1991): 39-48.
[2] Hidalgo-Tobon, S. S. "Theory of gradient coil design methods for magnetic resonance imaging." Concepts in Magnetic Resonance Part A 36.4 (2010): 223-242

Improved coils for MOTs (and other applications) are desirable, and improved methods of designing and producing such coils are also desirable. MOTs with improved configurations of shielding (field cancellation) and gradient coils are desirable.

SUMMARY

According to a first aspect of the invention, there is provided a method of designing at least one coil for producing a magnetic field, comprising:
i) setting a performance target comprising: a target magnetic field, and at least two of a target power, a target resistance, a target size and/or target weight, target power supply characteristics (e.g. a specified voltage), and a target inductance;
ii) determining initial design parameters for the at least one coil;
iii) modelling performance with the current design parameters to determine a simulated performance against each of the performance targets;
iv) calculating a penalty function based on the difference between the simulated performance and the performance targets;
v) modifying the design parameters in order to reduce the penalty function;
vi) iterating steps iii) to v) until the penalty function or simulated performance has met an acceptance condition.

The performance target may be more than three, or all of: a target power, a target resistance, a target weight, a target size, target power supply specifications and a target inductance.

Determining initial design parameters for the coils may comprise operating the at least one coils in series so that they are driven by a single power supply.

Optimisation for coil power, and/or size/weight, in addition to field fidelity enables designs of coil that are of more practical use for miniature and portable applications. Optimisation for inductance results in a coil with a reduced ring down, thereby enabling faster field switching/variation. Optimisation for resistance allows the coil to be matched with a particular voltage of power supply, which is important for applications in which power is provided from a fixed voltage (e.g. a battery).

The at least one coil may comprise at least one composite coil, each composite coil comprising a plurality of concentric cylindrical sub-coils optionally connected in series. Alternatively, one or more of the cylindrical sub-coils may be axially offset from one or more other of the sub-coils.

The sub-coils of each composite coil may define a planar composite coil, with each of the concentric sub-coils in a composite coil having an end face in the same plane.

The at least one coil may comprise at least one hybrid coil, each hybrid coil comprising at least one cylindrical sub-coil and at least one annular permanent magnet array as discussed hereinbelow.

Each hybrid coil may comprise a plurality of sub-coils, which together with each annular permanent magnet array may define a planar hybrid coil, with each of the concentric sub-coils and each permanent magnet array in a hybrid coil having an end face in the same plane.

The design parameters may include the number of sub-coils and/or the number of permanent magnets.

The design parameters may comprise at least one of:
the cross-sectional area of a wire of each sub-coil,
the total number of windings of each sub-coil;
the number of windings per radial layer of each sub-coil;
the number of radial layers of each sub-coil;
the inner and outer diameter of each sub-coil;
the direction of winding of each sub-coil; and
the packing configuration of the windings of each sub-coil.

The design parameters may comprise at least one of:
the cross-sectional area of a wire of the at least one coil,
the total number of windings of the at least one coil;
the number of windings per radial layer of the at least one coil;
the number of radial layers of the at least one coil;
the inner and outer diameter of the at least one coil;

the direction of winding of the at least one coil; and the packing configuration of the windings of the at least one coil.

The method may further comprise setting a design constraint for a design parameter.

The design parameters may comprise the cross-sectional area of the coil wire, and the design constraint may comprise restricting the cross-sectional area to a discontinuous set of available cross-sectional areas. These may correspond with a set of available wire gauges (e.g. from a particular wire supplier or combination of suppliers).

The design constraint may comprise a minimum inner diameter, for enabling optical access through a central opening in the coil.

The design constraint may comprise a maximum coil height in the axial direction.

The design constraint may comprise a maximum diameter of the coil.

The design constraint may comprise a number of sub-coils in each of the at least one coil (e.g. for either or both of the coils in a two-coil system).

The design constraint may comprise one or more of:
overall system size and/or fit to surrounding components;
coil weight;
power consumption;
coil excitation voltage.

The at least one coil may comprise a first and second coil, configured to be axially spaced apart.

The modelling of the performance may be based on the first and second coils being connected together in series.

The design parameters may comprise a distance between the first and second coil.

The first and second coils are not required to have identical design parameters (i.e. they may not be constrained to be symmetric or circular coils).

The modelling of the performance may be based on a fixed voltage power supply.

Modifying the design parameters may comprise using a multi-objective optimisation algorithm to minimise the penalty function. The penalty function may be weighted in order to emphasise the relative importance of the elements of the performance target. Any suitable approach may be used to minimise the penalty function, such as gradient descent, simulated annealing, or a genetic algorithm.

The target field may comprise an asymmetric field gradient.

The target field may comprise a substantially linear field gradient over a defied region proximate to the at least one coil.

The at least one coil may be designed simultaneously with at least one permanent magnet or permanent magnet array, and:
the design parameters may include magnet design parameters for the at least one magnet or magnet array; and
the modelling includes the field of both the at least one permanent magnet array and the field of the at least one coil.

The target magnetic field may be a field gradient suitable for a magneto-optical trap (e.g. comprising a field gradient of at least 10 G/cm).

The target field may comprise a first target field corresponding with a first coil current, and a second target field corresponding with a second coil current.

The method may further comprise optimising the permanent magnet or permanent magnet array and coil design to minimise the power consumed by the coil, based on a duty cycle of the second target field relative to the first.

According to a second aspect, there is provided a system for producing a magnetic field, comprising a first coil, wherein the first coil comprises a first sub-coil and a concentric or offset second sub-coil connected in series to the first sub-coil and arranged in a common plane therewith, wherein the second sub-coil differs from the first sub-coil in at least one of:
a wire cross sectional area;
a number of radial winding layers;
a number of turns per radial layer winding layer;
a winding configuration; and
a winding direction.

The design of the first coil may be produced according to the first aspect.

According to a third aspect, there is provided a magneto-optical trap or MOT, comprising the system according to the second aspect, wherein the system is configured to produce a magnetic field gradient for trapping cold atoms in a trapping region. The design of the first coil may be produced according to the first aspect.

The system may further comprise a second coil.

The first and second coil may be together configured to produce a field gradient suitable for trapping cold atoms in a magneto-optical trap.

The system or MOT may further comprise a support for holding the first and second coil spaced apart and co-axial.

The field gradient may be substantially linear over a region of 15 mm along the axis of the first second coil when they are mounted on the support.

The field gradient in the axial direction may be at least 10 G/cm.

The first coil may have a different design than the second coil.

The first and second sub-coil may comprise a different wire cross-sectional area.

The second coil may comprise at least a third and fourth sub-coil, and the third sub-coil may differ from the fourth sub-coil in at least one of:
a wire cross sectional area;
a number of radial winding layers;
a number of turns per radial layer winding layer;
a winding configuration; and
a winding direction.

The first coil and second coil may be symmetric about a plane normal to the axis of the first and second coils.

The first and second coil may be asymmetric about a plane normal to the axis of the first and second coils.

The first coil and the second coil may have a different external diameter.

The first coil and the second coil may have a different axial height.

The MOT may be a grating MOT (GMOT) comprising a single laser source for illuminating the trapping region, and diffractive optics for splitting and steering light from the single laser source into further trapping light beams that illuminate the trapping region.

According to a fourth aspect there is provided a system for producing a magnetic field, comprising a first hybrid magnetic coil, wherein the first coil comprises a first sub-coil and a first permanent magnet array.

The design of the first hybrid magnetic coil may be produced according to the first aspect.

As used herein the term "permanent magnet array" means one or more permanent magnets. Where there is only one permanent magnet, the magnet may be annular. Where there is a plurality of magnets, each magnet in the array is disposed in fixed orientation with respect to the other magnets present in the array, so as to produce a magnetic field which is temporally constant (i.e. which is not time varying—it will be appreciated that the magnetic field will be spatially varying, at least with distance from the array). Thus a permanent magnet array is one or more of permanent magnets designed to produce a desired magnetic field that together behave as a single permanent magnetic body. Such an array can thus be translated from place to place without altering the desired magnetic field generated by the array.

The first permanent magnet array may be annular.

The first coil and the first permanent magnet array may be concentric. Alternatively, a central axis of the first coil may be offset from a central axis of the first permanent magnet array.

The first hybrid magnetic coil may comprise an aperture disposed through the hybrid magnetic coil, which may be an inspection aperture for a MOT.

The first hybrid magnetic coil may be operable to produce a first magnetic field with a first current running through the first sub-coil and to produce a second magnetic field different to the first with a second current running through the first sub coil. Either of the first or second currents may be zero current. In that case the magnetic field produced by the hybrid magnetic coil will be substantially identical with a magnetic field produced by the permanent magnet array.

The first magnetic field may be a gradient field, which may be, e.g., suitable for trapping cold atoms in a MOT. The second magnetic field may not be a gradient field. The second current may be selected to substantially cancel a magnetic field produced by the permanent magnet array.

The first permanent magnet array may comprise at least one permanent magnet, and preferably comprises a plurality of permanent magnets.

The plurality of permanent magnets may be disposed on a holder, for example a substantially cylindrical or annular holder. The plurality of permanent magnets may be equally spaced around the holder. The holder may be formed of a non-magnetic material.

Each magnet of the plurality of permanent magnets may be identical to each of the other permanent magnets. Alternatively, one or more of the plurality of permanent magnets may differ from one or more others of the plurality of permanent magnets.

The plurality of permanent magnets may each have a polarity. A magnetic moment of each permanent magnet may be defined between two faces of that magnet, such that a first face of that magnet has a first polarity, and a second, opposing, face of that magnet has a second opposite polarity. The plurality of permanent magnets may be arranged, for example on the holder, so that the magnetic moments of each of the permanent magnets are oriented in substantially the same direction (i.e. are substantially parallel). The magnetic moments of the permanent magnets may be substantially perpendicular to a plane defined by the holder. Alternatively, the plurality of permanent magnets may be arranged, for example on the holder, so that a magnetic moment of at least one of the permanent magnets is oriented in substantially an opposite direction to one or more others of the plurality of permanent magnets.

The system may further comprise a second hybrid magnetic coil.

The first and second hybrid magnetic coils may be together configured to produce a field gradient suitable for trapping cold atoms in a magneto-optical trap. The first and second hybrid magnetic coils may be together configured to produce a quadrupole magnetic field.

The system may further comprise a support for holding the first and second hybrid magnetic coils spaced apart and co-axial.

The field gradient may be substantially linear over a region of 15 mm along the axis of the first second coil when they are mounted on the support.

The field gradient in the axial direction may be at least 10 G/cm.

The first hybrid magnetic coil may have a different design than the second hybrid magnetic coil.

The first hybrid magnetic coil and second hybrid magnetic coil may be symmetric about a plane normal to the axis of the first and second coils.

The first and second hybrid magnetic coils may be asymmetric about a plane normal to the axis of the first and second coils.

The first hybrid magnetic coil and the second hybrid magnetic coil may have a different external diameter.

The first hybrid magnetic coil and the second hybrid magnetic coil may have a different axial height.

According to a fifth aspect, there is provided a magneto-optical trap or MOT, comprising the system according to the fourth aspect, wherein the system is configured to produce a magnetic field gradient for trapping cold atoms in a trapping region.

The MOT may be a grating MOT (GMOT) comprising a single laser source for illuminating the trapping region, and diffractive optics for splitting and steering light from the single laser source into further trapping light beams that illuminate the trapping region.

The MOT may comprise a vacuum chamber and the system of the second aspect of the invention may be located adjacent the vacuum chamber such that the first and second magnetic fields are provided within the vacuum chamber.

The first hybrid magnetic coil may be located adjacent to a first side of the vacuum chamber, and the second hybrid magnetic coil may be located against a second side of the vacuum chamber opposing the first side.

The first and second hybrid magnetic coils may be coaxial or offset and spaced apart with the vacuum chamber between them.

According to a sixth aspect of the invention there is provided a magneto-optical trap or MOT, comprising a vacuum chamber comprising a trapping region, and a pair of permanent magnet arrays configured to produce a trapping magnetic field gradient for trapping cold atoms in the trapping region.

A first permanent magnet array may be located adjacent to a first side of the vacuum chamber and a second permanent magnet array may be located adjacent to a second side of the vacuum chamber such that the trapping field is provided within the vacuum chamber The pair of permanent magnet arrays may be designed using the method of the first aspect of the invention.

The features of each aspect may be combined with those of any other aspect, including optional features thereof.

BRIEF DESCRIPTION OF DRAWINGS

The invention will now be described by way of example with reference to the accompanying drawings, in which.

[3] McGilligan, James P., et al. "Grating Chips for Quantum Technologies." Scientific Reports 7.1 (2017): 384.

Figure 2:
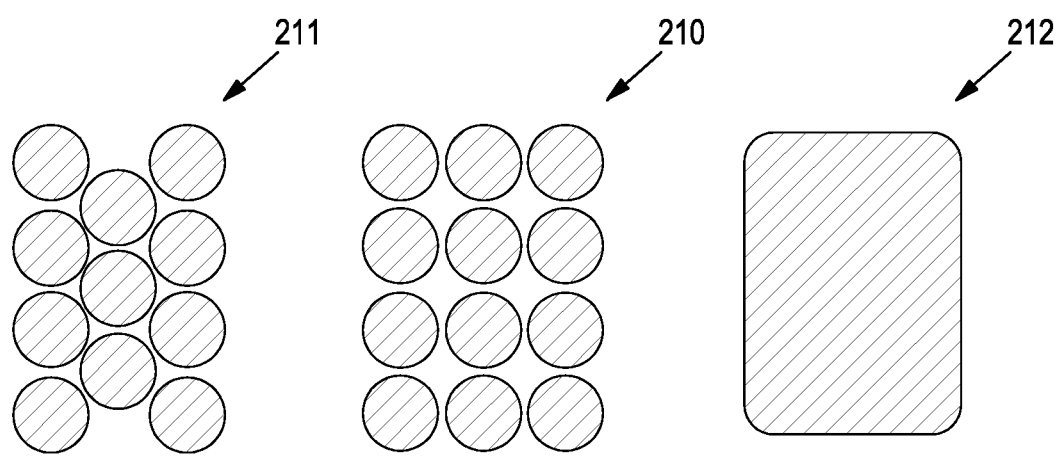
Figure 3:
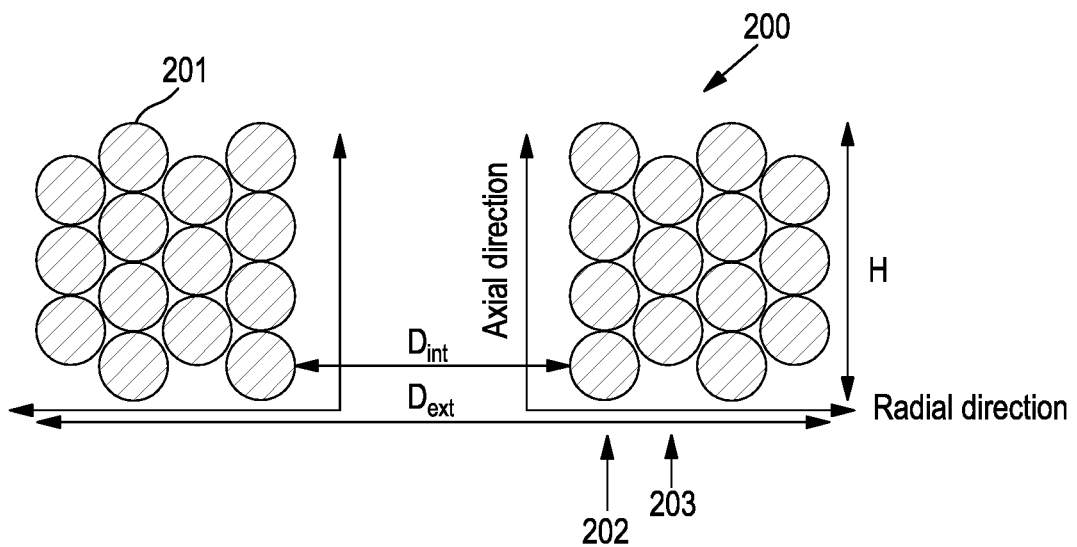
Figure 4:
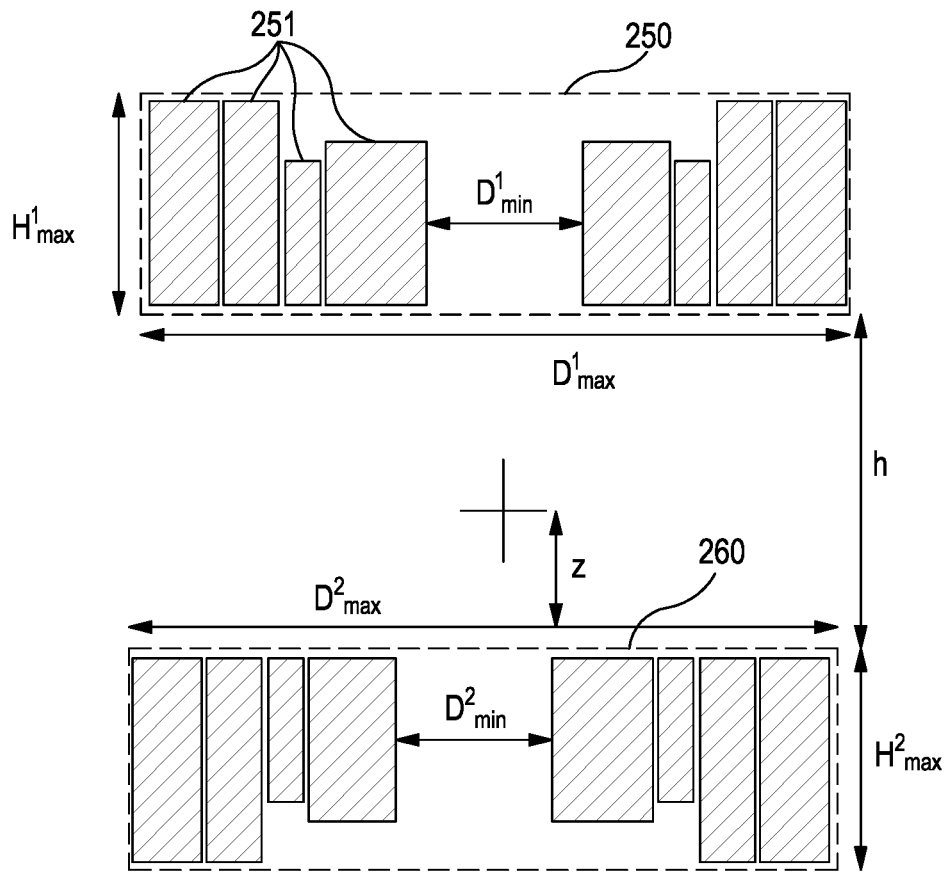
Figure 5:
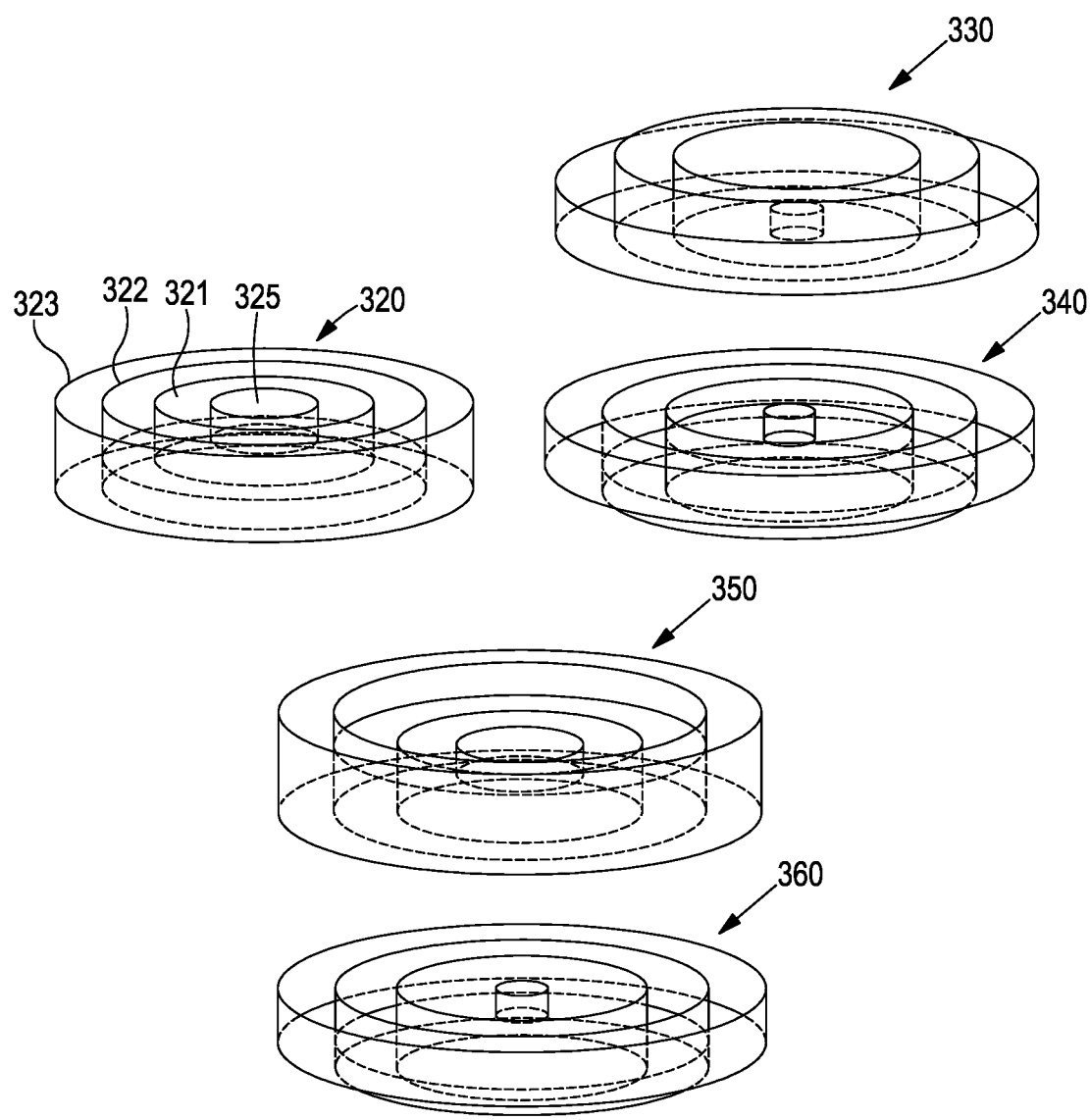
Figure 6:
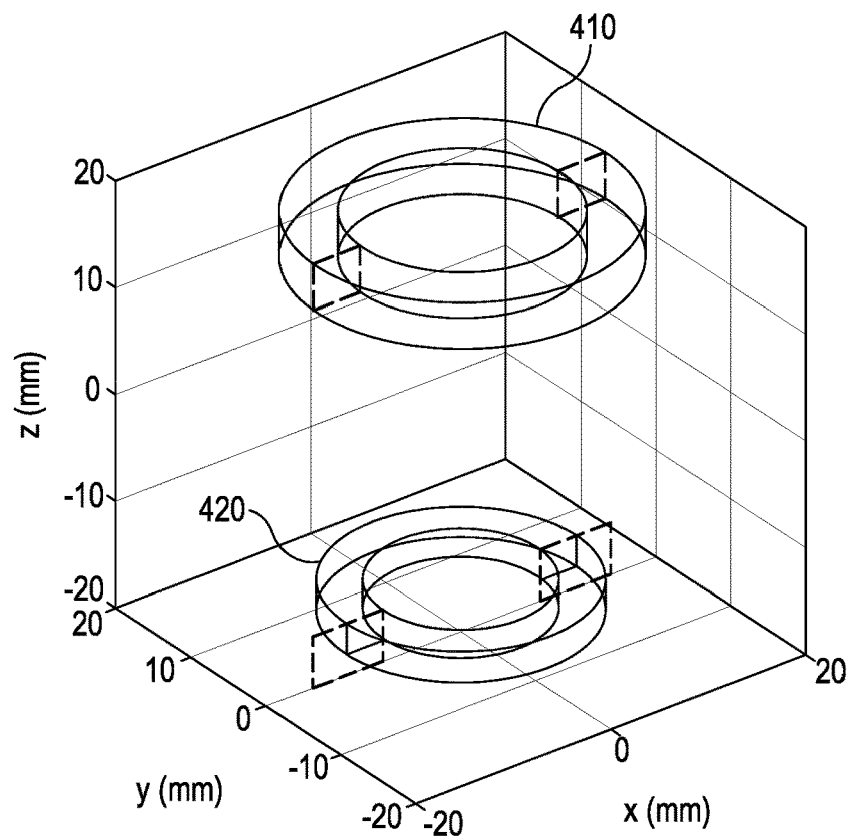
Figure 7:
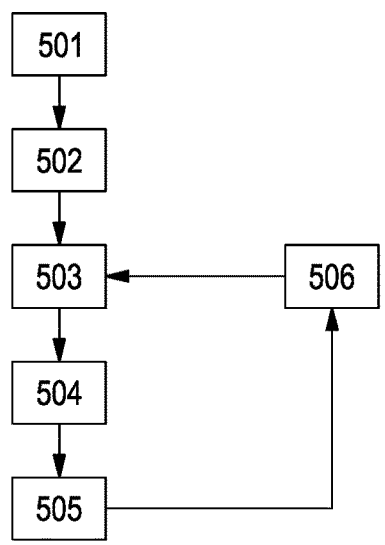
Figure 8:
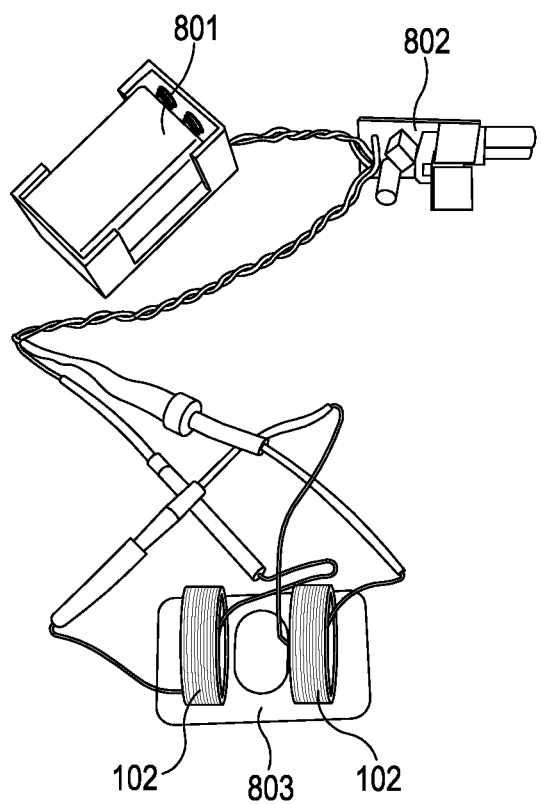
Figure 9:
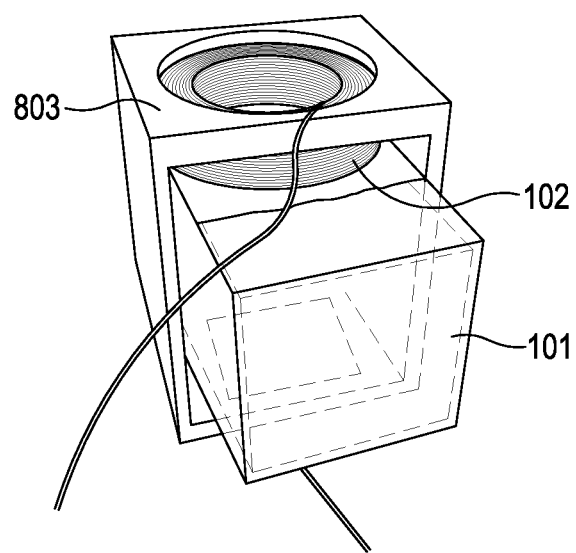
Figure 10:
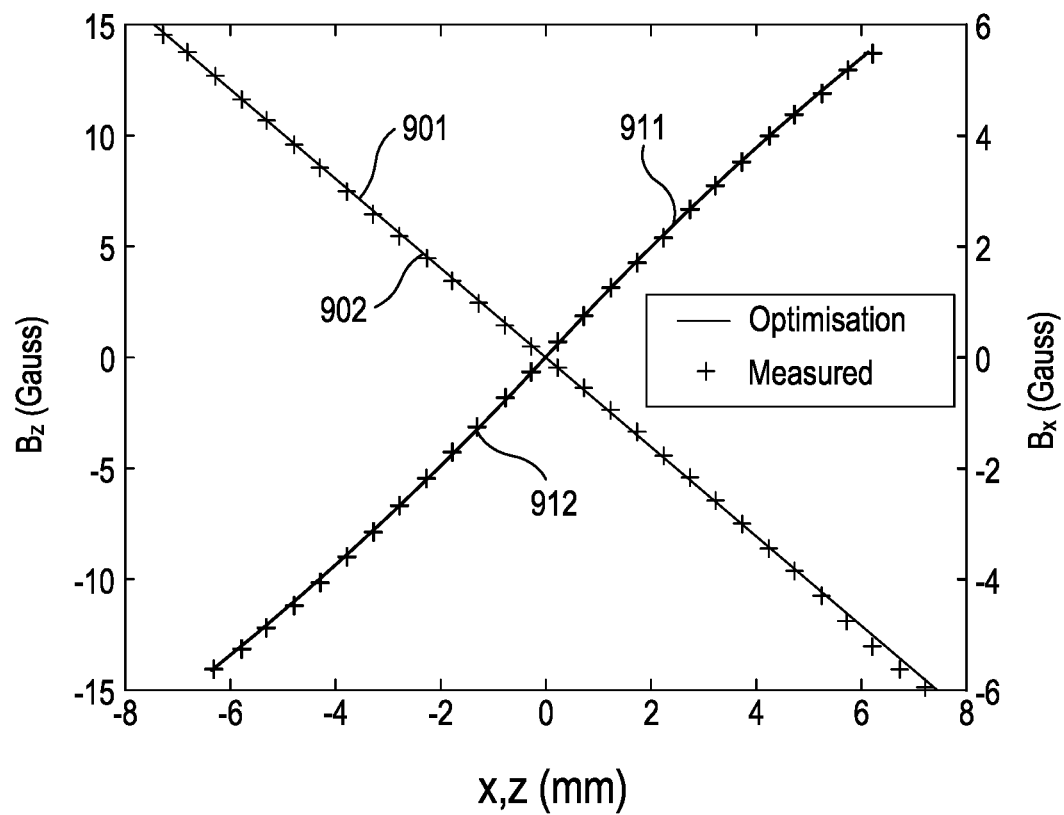
Figure 11:
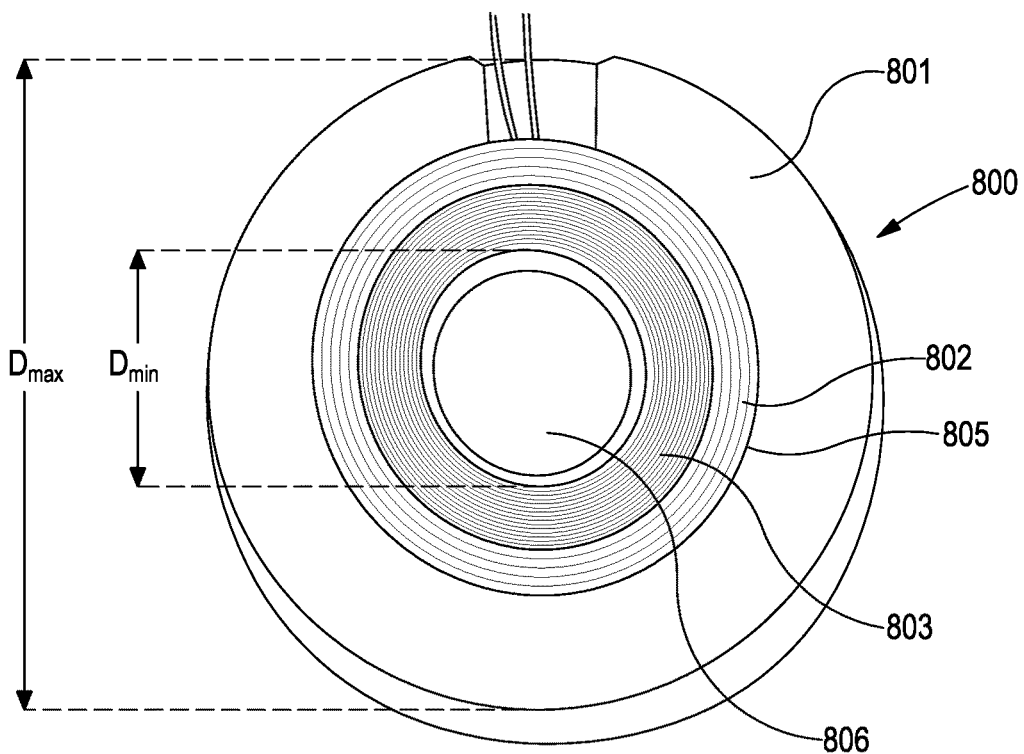
Figure 12:
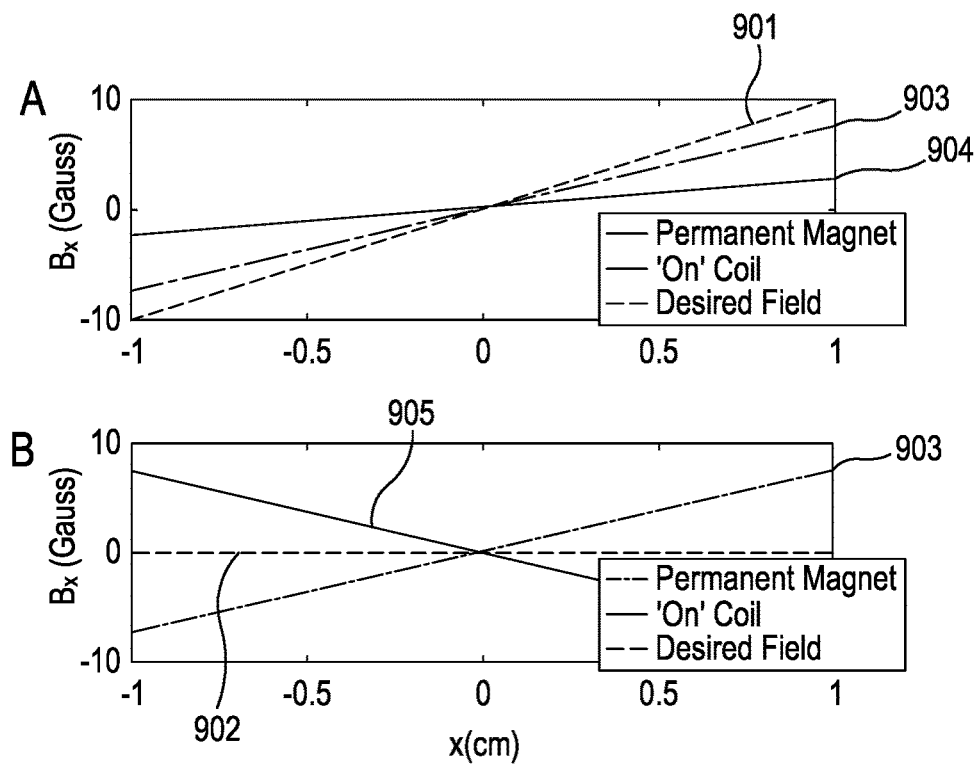
Figure 13:
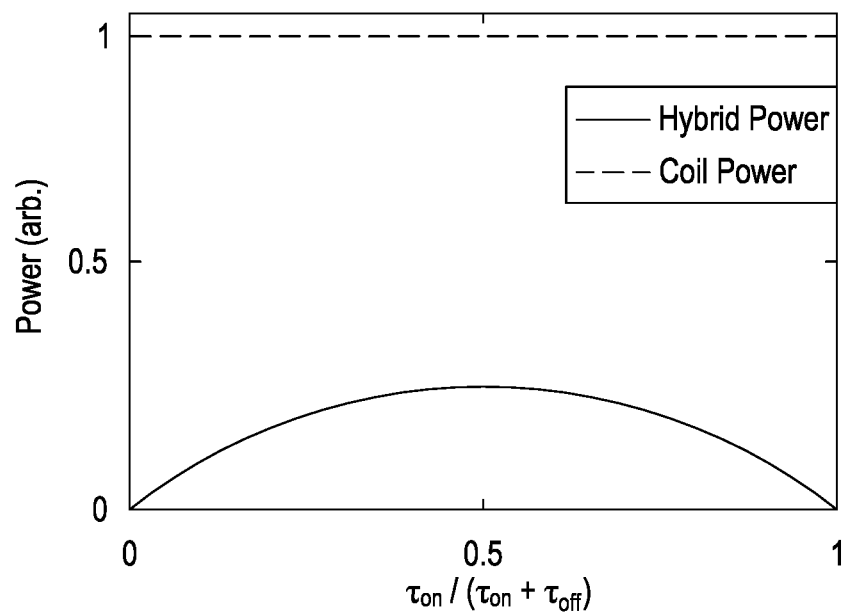
Figure 14:
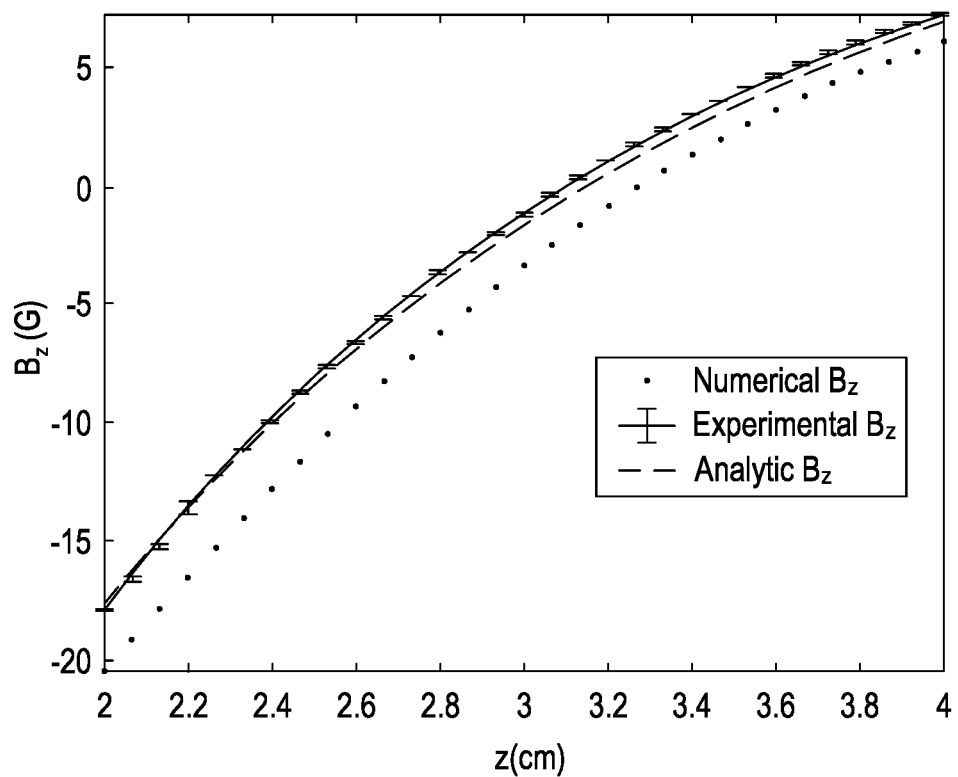
Figure 15A:
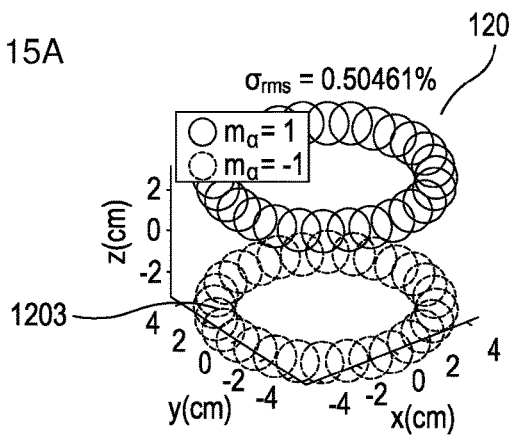
Figure 15B:
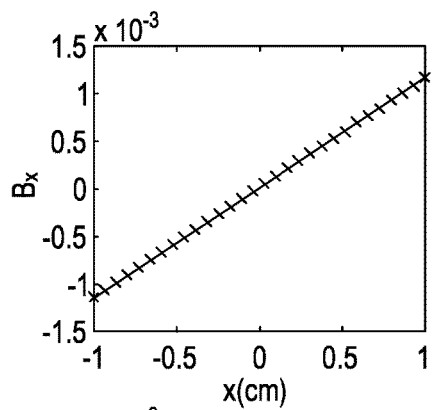
Figure 15C:
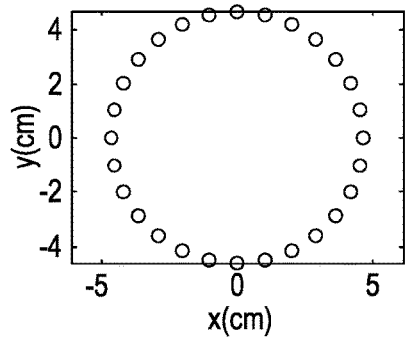
Figure 15D:
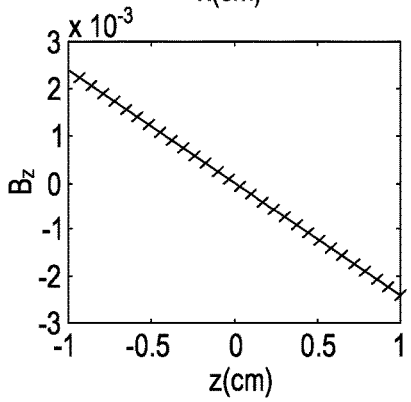
Figure 16:
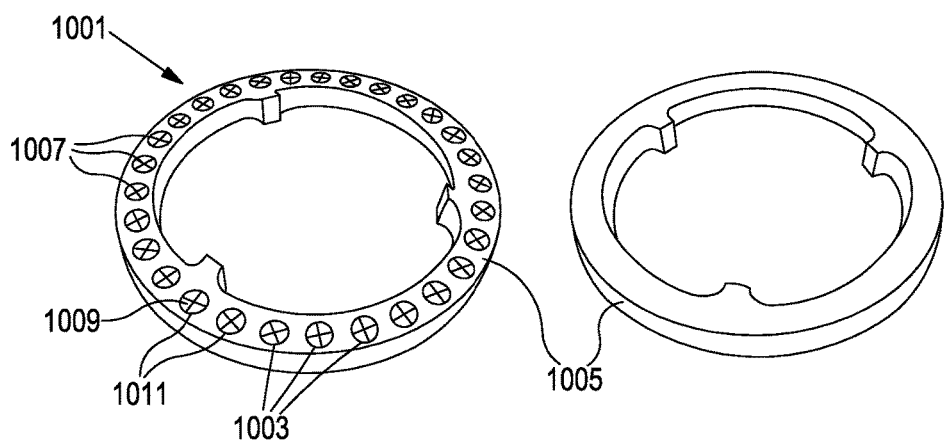

FIG. 2 shows cross sectional diagrams illustrating close packed hexagonal turns, square packed turns and a permanent magnet;

FIG. 3 is a cross sectional diagram of a close packed coil, illustrating some design parameters of the coil;

FIG. 4 is a cross sectional diagram of a pair of composite coils, illustrating some design parameters of the composite coil pair;

FIG. 5 shows some example embodiments of composite coils according to embodiments;

FIG. 6 shows a coil pair design according to an embodiment;

FIG. 7 is a flow diagram of a method according to an embodiment;

FIG. 8 is a coil pair design for use as a gradient coil in a MOT, with a battery based power supply;

FIG. 9 shows the gradient coil pair in use around a vacuum chamber of a magneto optical trap;

FIG. 10 is a graph showing the simulated and measured magnetic field (axial and radial) from the coil pair shown in FIGS. 8 and 9;

FIG. 11 shows an example hybrid magnetic coil;

FIG. 12 shows the axial magnetic field generated by a hybrid magnetic coil of the type shown in FIG. 11 when a first current is running through the sub-coils of the hybrid magnet (top graph) and when a second current is running through the sub-coils of the hybrid magnet (bottom graph);

FIG. 13 compares the power consumed by a coil assembly alone with the power consumed by the hybrid coil and permanent magnet set up calculated versus a parameter determined by the times, over one excitation cycle, for which the coil is powered ($\tau_{on}$) and unpowered ($\tau_{off}$);

FIG. 14 illustrates the agreement between a numerically calculated field profile and the experimentally-measured and analytically-calculated values;

FIG. 15A shows a desired magnetic field structure together with the directions of magnetisation, FIG. 15B shows agreement between calculated and target fields in the x (radial) direction, FIG. 15C shows a schematic top down illustration of a permanent magnet array capable of generating the fields structure shown in FIG. 15A, and FIG. 15D shows agreement between calculated and target fields in the z (axial) direction; and FIG. 16 shows an example of a permanent magnet array.

DETAILED DESCRIPTION

Figure 1:
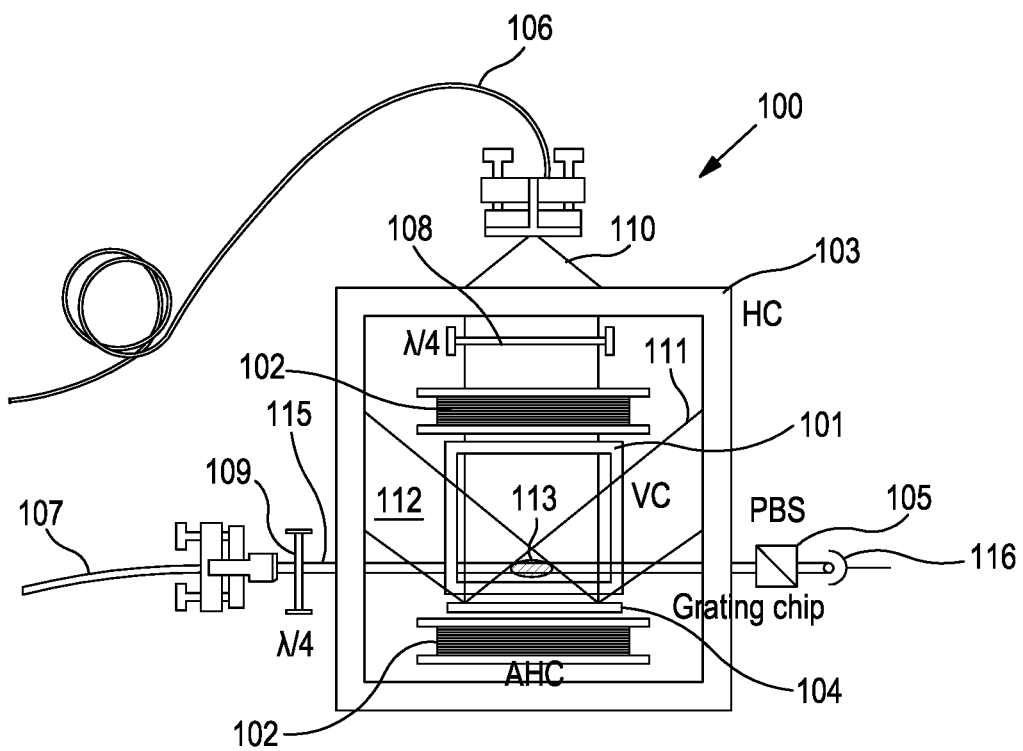
FIG. 1 is a schematic of a MOT (illustration from McGilligan et al[3])

FIG. 1 shows a magneto-optical trap (MOT) 100, which illustrates prior art field cancelling coils 103 and field gradient coils 102. In embodiments of the present invention, the field cancelling coils 103 and/or field gradient coils 102 may be replaced with coils according to this disclosure. Embodiments may include the other features of the MOT either with or without modification thereof.

The MOT 100 is a grating MOT or GMOT, but the invention is not limited to this type of MOT. This type of MOT may derive particular benefits from the reduced power and miniaturisation that are possible according to embodiments described herein.

The MOT 100 comprises field cancelling coils 103, field gradient coils 102, vacuum chamber 101 and diffraction grating 104. A trapping (and repumping) light beam 110 is provided via a first optical fibre 106. The trapping light beam 110 is circularly polarised by first quarter waveplate 108, and the beam may shaped/conditioned by further coupling optics (e.g. one or more lenses) between the first fibre 106 and the vacuum chamber 101.

The diffraction grating 104 diffracts the single incident trapping beam 110 to produce a balanced radiation field in the trap region 113. The diffraction grating 104 in embodiments may be inside or outside the vacuum chamber 101 (FIG. 1 shows the grating 104 is outside the chamber 101). The trap region 113 is within the vacuum chamber 101. Taking the z direction as along the axis of the trapping beam 110 as it enters the chamber 101, the x direction as in the plane of FIG. 1, and the y direction as normal to the plane of FIG. 1, the trap region 113 may be elevated in the direction above the bottom of the vacuum chamber 101 (for example by 5-10 mm or by 8 mm).

A second optical fibre 107 provides a probe beam 115 for sensing atoms in the trap region 113. The probe light beam 115 is circularly polarised by second quarter waveplate 109, and may be shaped by further coupling optics (e.g. one or more lenses) between the second fibre 107 and the vacuum chamber 101.

In the prior art MOT 100, the field cancelling coils 103 comprise a set of three coil pairs (i.e. 6 coils), the three coil pairs forming mutually perpendicular Helmholtz coils (i.e. along x, y z axes). The field cancelling coils 103 are therefore configured to produce a uniform field in the trap region 113 with a component in x, y and z that can be varied in accordance with the current in each of the x, y and z coils respectively. The prior art field cancelling coils are arranged in box configuration of 25×25×12 cm.

In the prior art MOT 100, the gradient coils 102 comprise a coil pair (i.e. two coils) with 12 cm diameter, arranged in an anti-Helmholtz configuration. In this example, and in accordance with an embodiment, the gradient coils 102 are configured to produce a field gradient in the z direction of 15 G/cm. The gradient coils 102 are symmetrically arranged above and below the plane of the grating 104.

The vacuum chamber 101 in embodiments may be less than 5 cm in extent in the z direction, for example between 2 cm and 4 cm.

The applicant has recognised that MOTs (and other applications) may derive significant benefit from improved coils that have been optimised against broad range of target parameters. For example, there is significant room for improvement over the conventional anti-Helmholtz gradient coils and Helmholtz field cancelling coils disclosed in McGilligan et al.

A schematic flow diagram of the optimisation process is illustrated in FIG. 7, which includes steps 501 to 506, as will be explained more fully below.

The optimisation process starts with step 501, with defining a performance target for the system (the system comprising one or more coils), that is defined in terms of both the target field and other performance factors, for instance including a target power, a target resistance and a target inductance. Each or any of these targets may be expressed in terms of a target range that must be achieved by the design, or as something to be maximised (or minimised). For example, the target field may be specified as a uniform magnetic field over a specific region within a specific RMS error (i.e. a target range, such as 2% RMS error or better), or the target field may be specified as an objective to achieve with the minimum RMS error. The target power may be to minimise the power required to achieve the target field, or to achieve a power below a specific value. The target resistance may be to achieve a resistance within a specific range or to minimise (or maximise) the resistance. The target inductance may be to achieve a specific range (e.g. under a target) or to minimise the inductance.

In some embodiments, the design may be subject to constraints. Such constraints may include a requirement for a coil pair to be symmetric, or a requirement for at least one coil to be a "simple" coil i.e. not a composite coil. In some embodiments the constraints may comprise maximum coil heights, a range of distances that a coil pair can be spaced apart, a minimum inner coil diameter (e.g. to accommodate a trapping laser), and maximum outer coil diameter, and/or a constraint on the number of sub-coils in each composite coil.

The coil designs disclosed herein may be based on winding of wires around formers, (e.g. cylindrical or rectangular/square formers), as well as permanent magnets (e.g. annular permanent magnets/permanent magnet arrays). The applicant has appreciated that additional degrees of freedom in optimising the design of such a coil can be obtained if the coil is a composite and/or hybrid coil, comprising more than one-sub coil, each of which has a different configuration and/or comprising at least one permanent magnet in addition to at least one sub-coil. The sub-coils/permanent magnet arrays of each coil may be concentric (i.e. co-axial) or offset and arranged in a common plane, which is to say that a common plane will intersect each sub-coil/magnet in a coil, for instance such that each sub-coil/magnet array defines an ellipse or circle where it intersects with the plane. In some embodiments, the axial face of each sub-coil/magnet array may be aligned in a common end-plane, but this is not essential. The sub-coils of each coil may be connected in series so that they share a common excitation current.

Some of the design parameters for specifying a coil are illustrated in FIGS. 2 to 4.

FIG. 2 shows two different winding configurations, showing a coil 211 that is hexagonal close packed, and a coil 210 that is square packed. FIG. 2 also shows a permanent magnet 212.

FIG. 3 shows a cross section 210 through a coil 200 that is hexagonal close packed, with an internal diameter $D_{int}$, an external diameter $D_{ext}$, and an axial height H. This coil 200 comprises a first axial layer 202 and a second axial layer 203. The number of turns in each axial layer in this hexagonal packed coil alternates between 4 layers and 3 layers, with the first axial layer 202 having 4 turns, and the second axial layer 203 having 3 turns. The number of turns per axial layer $N_z$ for a hexagonal packed coil may therefore be written as n:n−1, with n being the number of turns in the first axial layer (for the example of FIG. 3, $N_z$=4:3). There are 4 radial layers, $N_r$=4, in this design. The cross-sectional area of the coil wire may be specified in terms of a wire gauge (e.g. AWG, or a metric gauge).

FIG. 4 shows a pair of composite coils, comprising a first composite coil 250 and a second composite coil 260. The first and second composite coils each comprise a plurality of sub-coils 251. In this example the first and second composite coils 250, 260 are coaxial and symmetric to a plane normal to their common axis and between the coils. In the illustrated example, the sub-coils 251 of each coil 250, 260 are arranged with their end face in a common end plane, but as already discussed, this is not essential. The first composite coil has an inner diameter $D^1_{min}$ defined by the inner diameter of the innermost sub-coil, and an outer diameter $D^1_{max}$ defined by the outer diameter of the outermost sub-coil. The height of the first composite coil $H^1_{max}$ is defined by the height of the sub-coil with the maximum height. The second composite coil has an inner diameter $D^2_{min}$ defined by the inner diameter of the innermost sub-coil, and an outer diameter $D^2_{max}$ defined by the outer diameter of the outermost sub-coil. The height of the second composite coil $H^2_{max}$ is defined by the height of the sub-coil with the maximum height.

Each sub coil may have a different wire cross sectional area, number of radial winding layers, number of axial winding layers, packing, and/or direction of winding. The number of sub-coils and the design of each sub-coil are therefore parameters that can be optimised in a system that comprises one or more composite coils.

In the coils shown in FIG. 4, one or more of the sub-coils may be replaced by a permanent magnet array, as will be discussed in more detail below.

Once a performance target and/or constraints are defined, the optimisation process may be started from initial design parameters for the system (of at least one coil). At step 502 the initial design parameters are generated. The initial design parameters may be randomly generated, or may be derived from an analytical approximation to a good design.

The performance of the current design is subsequently modelled at step 503 using computer implemented methods (e.g. using analytical or numerical methods to solve Maxwell's equations or equivalent formulations such as the Biot-Savart law). The simulated performance obtained in this way is compared to the performance targets at step 504, and a penalty function determined, for example using a weighted sum of the errors between the simulated performance and the performance targets.

At step 505 the design parameters are modified to reduce the penalty function. There are a number of ways to perform multi-parameter optimisation, and any suitable method may be used, such as gradient descent, simulated annealing, a genetic algorithm etc.

The steps of modelling performance, calculating a penalty function and then modifying the design are repeated until the penalty function has met an acceptance condition. In FIG. 7 this iteration is represented by step 506.

The acceptance condition may be defined in a number of ways. In some embodiments, the iteration may continue until the penalty function converges (i.e. does not change by more than a specific proportion in a specific number of iterations), which will indicate that the optimisation has reached a local minima. In other embodiments, the optimisation may be halted when the performance of the design has met the performance targets.

Examples of coils that may be generated using the optimisation method described herein are shown in FIG. 5, which shows: a single composite coil 320 having three sub-coils 321, 322, 323; a symmetric composite coil pair comprising a first composite coil 330 and a second composite coil 340; an asymmetric coil pair comprising a first composite coil 350 and a second composite coil 360 with a different design to the first composite coil 350.

FIG. 6 illustrates a schematic system of coils 410, 420 for which the design has been optimised. The coils 410, 420 are for use as gradient coils in a MOT of the type shown in FIG. 1. The target field is a 15 G/cm z axial gradient in a trap region between the coils. The coils 410, 420 must accommodate a vacuum chamber and diffraction grating between them. The chamber and grating define the location of the trap region, which is closer to the lower coil 420 than the upper coil 410. The first coil 410 has a design constraint that it must allow a 2 cm trapping beam to enter the vacuum chamber, and must therefore have an internal diameter of at least 2 cm. This constraint is not present for the second coil 420.

A first design that has been produced by this optimisation approach is described below in Table 1.

TABLE 1

Design parameters for example gradient coil design 1

| Coil | $D_{int}$ (mm) | $D_{ext}$ (mm) | AWG | $N_r$ | $N_z$ | $N_{tot}$ | H (mm) | L (m) | R (Ω) | Winding Direction |
|---|---|---|---|---|---|---|---|---|---|---|
| 1 | 18.00 | 21.62 | 28 | 8 | 10-9 | 76 | 3.84 | 4.84 | 0.746 | CW |
| 2 | 20.00 | 29.15 | 33 | 20 | 19-18 | 370 | 4.98 | 30.13 | 10.17 | CW |

This first design was produced with a design constraint of the first and second coils being "simple coils" with only one sub-coil.

A second design was produced with a design constraint of there being two sub-coils in both the first and second sub-coil. The design parameters of the second design are given below in Table 2.

TABLE 2

Design parameters for example gradient coil design 2

| Coil | $D_{int}$ (mm) | $D_{ext}$ (mm) | AWG | $N_r$ | $N_z$ | $N_{tot}$ | H (mm) | L (m) | R (Ω) | Winding Direction |
|---|---|---|---|---|---|---|---|---|---|---|
| 1a | 16.00 | 18.12 | 24 | 2 | 7-6 | 13 | 3.97 | 0.754 | 0.053 | CW |
| 1b | 18.12 + δ | 20.83 | 26 | 8 | 10-9 | 76 | 4.65 | 5.53 | 0.576 | CW |
| 2a | 20.00 | 24.69 | 35 | 2 | 15-14 | 29 | 3.32 | 1.93 | 0.921 | CW |
| 2b | 24.69 + δ | 29.97 | 33 | 20 | 19-18 | 370 | 4.98 | 31.19 | 10.53 | CW |

The design parameter δ represents a clearance between the first and second sub-coil, which may be 0.5 mm, for example (or some other dimension less than 1 mm). The wire gauges are chosen from America Wire Gauges (AWG), and the insulation thickness was assumed to be 4 microns (i.e. increasing the wire diameter by 8 microns).

The optimised coils disclosed require reduced power to produce the same field, and also provide improved field fidelity over the prior art anti-Helmholtz design of two identical coils.

FIG. 8 shows an example gradient coil pair 102, which was optimised to be powered by from a battery 801 (e.g. via a voltage or current regulator 802). A frame 803 is provided for supporting the coils in a separated configuration, so that a vacuum chamber can be placed therebetween. The battery 801 may be a PP3 battery.

FIG. 9 shows the gradient coil 102 in situ around a vacuum chamber 101 of a MOT (similar to that shown in FIG. 1). The vacuum chamber 101 is connected to a vacuum system that is configured to introduce a cold atom vapour to the vacuum chamber for trapping in optical molasses.

FIG. 10 shows the simulated axial field 901, the simulated radial field 911, the measured axial field 902 and the simulated radial field 912, for the gradient coil 102 shown in FIGS. 8 and 9. The axial field gradient is substantially linear and is at least 15 G/cm. The radial field gradient is also substantially linear, and is around 10 G/cm.

The gradient coil 102 shown in FIGS. 8 to 9 was operated as a gradient coil for a MOT for more than 3 hours (power dissipated in coils=100 mW, current=50 mA) powered by a PP3 battery rather than via mains power.

The volume that the gradient coils 102 in FIGS. 8 and 9 enclose is an order of magnitude smaller than prior art "compact" MOT coils, which typically enclose a volume of at least (60 mm)³. A "standard" laboratory MOT coil typically requires (80×80×60) mm³. Typical existing laboratory MOTs consume around 0.5 W and are not powered by batteries.

FIG. 11 shows an exemplary hybrid magnetic coil 800. The hybrid magnetic coil comprises an inner sub-coil 803 and an outer sub-coil 802. The hybrid magnet coil further comprises a permanent magnet array 804, which in this case is an annular permanent magnet array having an inner diameter and an outer diameter and a central aperture 805 within which the inner and outer sub-coils are received. The inner and outer sub-coils fit tightly within the central aperture of the permanent magnet array, such that the inner diameter of the permanent magnet array is substantially equal to an outer diameter of the outer sub-coil. It will be appreciated that the permanent magnet array need not be located outside of the sub-coil(s). For instance, one or more sub-coils could be wound around the outside of the permanent magnet array in addition to or instead of the one or more sub-coils wound inside the permanent magnet array.

The hybrid magnetic coil comprises an inspection aperture 806 extending fully through the coil. When in use in a MOT the inspection aperture may permit a laser beam to enter the trapping region, and thus is appropriately sized for this purpose. In this case the aperture circular and concentric with the axes of the sub-coils and permanent magnet array such that the aperture is formed through the centre of the hybrid coil. It will be appreciated that the aperture might be a different shape, e.g. if the sub-coils/magnet array(s) are not cylindrical.

In this example the sub-coils 803, 802, together with the permanent magnet array 804, are arranged with their end faces in a common end plane, but as already discussed, this is not essential. The hybrid magnetic coil has an inner diameter $D_{min}$ defined by the inner diameter of the innermost sub-coil, and an outer diameter $D_{max}$ defined by the outer diameter of the outermost sub-coil, which in this example is the outer diameter of the permanent magnet array 804. The height of the hybrid coil (not shown) is defined by the height of the sub-coil/permanent magnet array with the maximum height.

Each wire sub-coil may have a different wire cross sectional area, number of radial winding layers, number of axial winding layers, packing, and/or direction of winding. The number of sub-coils and the design of each sub-coil are therefore parameters that can be optimised in a system that comprises one or more composite coils. The hybrid magnet coil shown might have more or fewer sub-coils, and might comprise a plurality of permanent magnet arrays. Each permanent magnet array might produce a different magnet field.

As shown in FIG. 12, a hybrid magnetic coil of the type shown in FIG. 11 can have two distinct electrical configurations, each generating a distinct magnetic field. Graph A of FIG. 12 (top graph) shows the desired magnetic field 901 to be produced by the hybrid coil when it is in an 'On' Configuration. As shown, this is a substantially linear axial gradient field. Graph B of FIG. 12 (bottom graph) shows the desired magnetic field 902 to be produced by the hybrid coil when it is in an 'Off' Configuration. As shown, this is a substantially null field.

As used herein, the term permanent magnet means an object made from a material that is magnetized and creates its own persistent magnetic field. Such materials are typically ferromagnetic, and can be divided into magnetically "soft" materials, which can be magnetized but do not tend to stay magnetized, and magnetically "hard" materials, which do. "Hard" materials have high coercivity, whereas "soft" materials have low coercivity. Permanent magnets each have a polarity, with one pole of the magnet being referred to as a north pole (which points towards the Earth's geographical north pole when freely suspended and unaffected by other local magnetic fields) and the other, opposite, pole being designated as a south pole. The magnetic field generated by the magnet, denoted B, is a vector field. The magnetic B field vector at a given point in space is specified by two properties: (1) its direction, which is along the orientation of a compass needle, and (2) its magnitude, which is proportional to how strongly the compass needle orients along that direction.

The permanent magnet array shown in FIG. 11 comprises one or more hard permanent magnets and generates a permanent magnetic field 903. When it is desired to turn the hybrid coil 'On', i.e. to generate the desired magnetic field 901, then the sub-coils (or sub-coil, if there is only one) are energised with a first current in order to produce a first sub-coil magnetic field 904. Together the permanent magnetic field and the first sub-coil magnetic field combine to produce the desired magnetic field 901.

Alternatively, when it is desired to turn the hybrid coil 'Off', i.e. to substantially eliminate the permanent magnetic field 903, then the sub-coils (or sub-coil, if there is only one) are energised with a second current in order to produce a second sub-coil magnetic field 905. Together the permanent magnetic field and the first sub-coil magnetic field combine to produce the null magnetic field 902.

In an MOT application, both fields (i.e. produced by the permanent magnet array and by the activated sub-coils) pass linearly through zero in all three spatial directions with a gradient of order 15 G/cm. This ensures that Doppler cooling cools the atomic gas by slowing the atoms within it.

Using such a hybrid coil it is possible to produce a gradient field using a permanent magnet array which can nevertheless be turned off as required. Permanent magnets consume less power than electromagnets, and hence a gradient field can be generated with a hybrid coil of this type using less power than the same field gradient generated with a conventional electromagnetic coil, as shown in FIG. 13. See also FIG. 14, which illustrates the agreement between the numerically-calculated magnetic field profile, (black dots) and the experimentally-measured (blue bars) and analytically-calculated values (red dashes).

It should be noted that in order to generate the first or second hybrid magnetic field the sub-coils remain energised with the first or second current for the duration of the time which that field is required. For example, the sub-coils remain energised with the first current 904 for the whole time that the first desired field 901 is being generated. Similarly, the sub-coils remain energised with the second current 905 for the whole time that the second desired field 902 is being generated.

Referring now to FIG. 16, this shows an exemplary permanent magnet array 1001 suitable for use in a MOT, for instance in a hybrid coil of the type discussed above. FIG. 13 picture A shows a top view in which it can be seen that the permanent magnet array 1001 comprises a plurality of permanent magnets 1003 arranged on a holder 1005. Conversely, FIG. 16 picture B shows a bottom view in which the magnets are not visible. The holder may be formed from a non-magnetic material so as to not disrupt the field generated by the permanent magnets.

Each of the permanent magnets 1003 is substantially cylindrical, and has a magnetic moment defined between two faces of that magnet, such that a first face of that magnet has a first polarity (e.g. north), and a second, opposing, face of that magnet has a second opposite polarity (i.e. south).

In the example permanent magnet array 1001 shown, the plurality of permanent magnets 1003 are arranged on the holder so that the magnetic moments of each of the permanent magnets are oriented in substantially the same direction (i.e. are substantially parallel to each other). In particular, the holder, which in this example is substantially annular, defines a plane (which may be the common plane defined by the hybrid coil, as discussed above). The permanent magnets 1003 are arranged on the holder 1005 such that the magnetic moments of the permanent magnets are substantially perpendicular to the plane defined by the holder. This is indicated in FIG. 16 by red crosses 1007, indicating that the field lines enter into the permanent magnets perpendicular to the plane of the array. Thus the faces 1009 of the magnets visible in the diagram are all south poles. The corresponding north poles are housed within apertures 1011 provided in the holder and are not visible in FIG. 16. The magnets may be fixed within the apertures by any suitable means, e.g. adhesive/friction.

When used in a MOT, the array is located such that the axes of the permanent magnets are parallel to the axial direction (z direction) of the MOT. A second permanent magnet array of the type shown in FIG. 16 can be provided such that together the two arrays, when axially spaced apart, generate a trapping field in a vacuum chamber of the MOT. As discussed above, the trapping field may be nulled by energising a coil that is concentric with (or offset from) the permanent magnet array with a selected current.

Referring now to FIG. 15, this Figure schematically illustrates in picture (a) a desired magnetic structure along with the directions of the magnetisation in each case, where red indicates first field lines 1201 generated by a first modelled permanent magnet array flowing in a first direction (e.g. clockwise) and blue indicates second field lines 1203 generated by a second modelled permanent magnet array flowing in a second, opposite, direction (e.g. anticlockwise). Agreement between the calculated (red crossed) and target (black dashed curve) field in the x direction is shown in picture (b) (RMS difference between the fields, $\sigma_{rms}$, is in this example 0.50461%).

The top down view of the magnet structure required to generate the field shown in picture (a) is shown in picture (c). This shows a calculated representation similar to the real example given in FIG. 16. It will be noted that the plurality of magnets shown are cylindrical and share the same radius. As discussed above, the axes of the magnets are parallel to one another (i.e. parallel to the z direction). Agreement between calculated (red crossed) and target (black dashed curve) field in the z direction is shown in picture (d).

It will be appreciated that the example shown in FIGS. 15 and 16 is only one possibility, and that where a different target field is desired a different permanent magnet array configuration may be provided. If desired, a magnetic moment of at least one of the permanent magnets may be oriented in an opposite direction to one or more others of the plurality of permanent magnets.

Although we discuss above the use of a hybrid magnetic coil which permits the field generated by a permanent magnet to be made sufficiently linear for use in a MOT and/or to be turned "off" as desired, it should be noted that using the method of coil design described above it is possible to design a permanent magnet array having a sufficiently constant field gradient for use in a MOT alone, without an accompanying sub-coil. That is, it is possible to generate a trapping field with only permanent magnets if required. This can be done by minimising a cost function whose parameters (size, magnetisation, etc.), positions and orientations are chosen similar to that for the coils but without a power term. Such a permanent magnet array could not be "turned off" at will, unlike the composite and hybrid coils discussed above.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A method of designing at least one coil for producing a magnetic field, comprising:
   i) setting a performance target comprising: a target magnetic field, and at least two of a target power, a target resistance, a target size and/or weight, a target supply voltage or current, and a target inductance;
   ii) determining initial design parameters for the at least one coil, wherein the at least one coil is designed simultaneously with at least one permanent magnet;
   iii) modelling performance with the current design parameters to determine a simulated performance against each of the performance targets, and the modelling includes the field of both the at least one permanent magnet and the field of the at least one coil;
   iv) calculating a penalty function based on the difference between the simulated performance and the performance targets;
   v) modifying the design parameters in order to reduce the penalty function, wherein the target magnetic field comprises a first target field corresponding with a first coil current, and a second target field corresponding with a second coil current; wherein modifying step comprising optimizing the permanent magnet and coil design to minimize the power consumed by the coil, based on a duty cycle of second target field relative to the first target field while producing same magnetic field;
   vi) iterating steps iii) to v) until the penalty function or simulated performance has met an acceptance condition.

2. The method of claim 1, wherein the at least one coil comprises at least one composite coil, each composite coil comprising a plurality of concentric or offset cylindrical sub-coils connected in series.

3. The method of claim 2, wherein the sub-coils of each composite coil define a planar composite coil, with each of the concentric sub-coils in a composite coil having an end face in the same plane.

4. The method of claim 2, wherein
the design parameters include the number of sub-coils.

5. The method of claim 1, further comprising setting a design constraint for a design parameter.

6. The method of claim 5, wherein
the design parameters comprise the cross-sectional area of the coil wire, and the design constraint comprises restricting the cross-sectional area to a discontinuous set of available cross-sectional areas.

7. The method of claim 1, wherein the at least one coil comprises a first and second coil, configured to be axially spaced apart.

8. The method of claim 7, wherein the modelling of the performance is based on the first and second coils being connected together in series.

9. The method of claim 7, wherein the design parameters comprise a distance between the first and second coil.

10. The method of any of claim 7, wherein the first and second coils are not required to have identical design parameters.

11. The method of claim 1, wherein modelling of the performance is based on a fixed voltage power supply.

12. The method of claim 1, wherein modifying the design parameters comprises using a multi-objective optimisation algorithm to minimise a penalty function that is weighted according to the relative importance of different parts of the performance target.

13. The method of claim 1, wherein the target field comprises one or more of an asymmetric field gradient and a substantially linear field gradient over a defied region proximate to the at least one coil.

14. The method of claim 1, wherein
the design parameters include magnet design parameters for the at least one magnet.

15. A magneto optical traps system for producing an electric field, comprising at least one coil for producing a magnetic field, said coil designed according to the method of claim 1.

16. The system of claim 15, wherein said coil comprises a first sub-coil and a concentric or offset second sub-coil connected in series to the first sub-coil and arranged in a common plane therewith, wherein the second sub-coil differs from the first sub-coil in at least one of:
   a wire cross sectional area;
   a number of radial winding layers;
   a number of turns per radial layer winding layer;
   a winding configuration; and
   a winding direction.

17. A magneto optical trap (MOT), comprising the system of claim 15, wherein the system is configured to produce a magnetic field gradient for trapping cold atoms in a trapping region.

18. The MOT of claim 17, wherein the system further comprises a second coil.

19. The method of claim 2, wherein the design parameters comprise at least one of:
   the cross-sectional area of a wire of each sub-coil,
   the total number of windings of each sub-coil;
   the number of windings per radial layer of each sub-coil;

the number of radial layers of each sub-coil;
the inner and outer diameter of each sub-coil;
the direction of winding of each sub-coil; and
the packing configuration of the windings of each sub-coil.

20. The method of claim 5, wherein the design constraint comprises a minimum inner diameter, for enabling optical access through a central opening in the coil.

21. The method of claim 5, wherein the design constraint comprises a maximum coil height in the axial direction.

22. The method of claim 5, wherein the design constraint comprises a maximum diameter of the coil.

23. The method of claim 5, wherein the at least one coil comprises at least one composite coil, each composite coil comprising a plurality of concentric or offset cylindrical sub-coils connected in series, and the design constraint comprises a number of sub-coils in each of the at least one coil.

24. The method of claim 5, wherein the design constraint comprises one or more of:
overall system size and/or fit to surrounding components;
coil weight;
power consumption; and
coil excitation voltage.

25. The system of claim 15, wherein said coil comprises a first sub-coil and a first permanent magnet array.

* * * * *